United States Patent [19]
Bauer et al.

[11] Patent Number: 5,661,315
[45] Date of Patent: Aug. 26, 1997

[54] CONTROLLABLE POWER SEMICONDUCTOR COMPONENT

[75] Inventors: Friedhelm Bauer, Suhr, Switzerland; Reinhold Bayerer, Reichelsheim, Germany; Thomas Stockmeier, Rancho Palos Verdes, Calif.

[73] Assignee: Asea Brown Boveri AG, Baden, Switzerland

[21] Appl. No.: 579,763

[22] Filed: Dec. 28, 1995

[51] Int. Cl.⁶ .................................................. H01L 29/74
[52] U.S. Cl. .......................... 257/181; 257/785; 257/786
[58] Field of Search .................................. 257/139, 785, 257/177, 691, 692, 698, 726, 181, 182, 727, 786

[56] References Cited

U.S. PATENT DOCUMENTS

| | | | |
|---|---|---|---|
| 3,525,910 | 8/1970 | Philips | 257/785 |
| 4,035,831 | 7/1977 | Saeki | 257/785 |
| 4,358,785 | 11/1982 | Takigami et al. | 257/785 |
| 4,500,907 | 2/1985 | Takigami et al. | 257/785 |
| 5,539,220 | 7/1996 | Takahashi | 257/177 |

FOREIGN PATENT DOCUMENTS

| | | | |
|---|---|---|---|
| 1351867 | 12/1963 | France | 257/181 |
| 0057977 | 10/1979 | Japan | 257/181 |
| 0057976 | 10/1979 | Japan | 257/181 |
| 0232303 | 8/1994 | Japan | 257/785 |

*Primary Examiner*—Tom Thomas
*Assistant Examiner*—David B. Hardy
*Attorney, Agent, or Firm*—Oblon, Spivak, McClelland, Maier & Neustadt, P.C.

[57] ABSTRACT

In the case of a controllable power semiconductor component, which comprises at least one planar, essentially rectangular power semiconductor chip (13), which power semiconductor chip (13) has on its top side a large-area metallization layer (14) for the large-area electrical connection to a metal mating element (17, 19), and also a separate small-area connection region for the gate connection in the form of a gate pad (16), a simplified form of the metal mating element (17, 19) and adjustment thereof are achieved by virtue of the fact that the gate pad (16) is arranged in a corner of the power semiconductor chip (13).

5 Claims, 1 Drawing Sheet

CONTROLLABLE POWER SEMICONDUCTOR COMPONENT

BACKGROUND OF THE INVENTION

1. Field of the Invention

The present invention is concerned with the field of power electronics. It relates to a controllable power semiconductor component, comprising at least one planar, essentially rectangular power semiconductor chip, which power semiconductor chip has on its top side a large-area metallization layer for the large-area electrical connection to a metal mating element, and also comprising a separate small-area connection region for the gate connection in the form of a gate pad.

Such a power semiconductor component is known, for example, in the form of an IGBT module in the prior art.

2. Discussion of the Background

High-power IGBT modules are subject to very stringent service life and reliability requirements, especially in the traction field. This applies, in particular, to the installation and connection of the individual power semiconductor chips in the module. Such power semiconductor chips 1 and 7 are illustrated in plan view in FIGS. 1 and 2, respectively. In order to increase the reliability of the connection between the top side of the installed power semiconductor chips 1, 7 and the module body in comparison with a simple bond, it is possible, given a corresponding large-area metallization layer 2 and 8, respectively, and insulation of the gate runner regions 3 and 9, respectively, on the chip, for a metal mating element 5 and 11, respectively, (for example a molybdenum disk or a metal punch) to be soldered onto the top side of the component. Analogously to the bonding wires, this metal mating element 5, 11 must distribute the current as uniformly as possible over the area of the chip. This produces the requirement that as far as possible the entire emitter metallization layer 2, 8 of the chip 1, 7 be covered by the soldered-on metal. Some of the resulting surface shapes of the metal mating element are complex, having corresponding cutouts 6 and 12, respectively, which entail additional costs and at the same time require a high outlay on adjustment.

In the case of the known IGBT designs, such as are represented by way of example in FIGS. 1 and 2, the gate pad 4 and 10, respectively, for the gate connection is arranged either in the center of the chip (FIG. 1) or in the center of an outer side of the chip (FIG. 2). It thus becomes almost impossible to find a metal mating element which has a simple shape, satisfies the task of uniform current distribution and at the same time does not require a great deal of adjustment.

SUMMARY OF THE INVENTION

Therefore, the object Of the invention is to provide a controllable power semiconductor component in which uniform current distribution in conjunction with reduced requirements on the adjustment accuracy are made possible by means of a metal mating element having a simple shape.

In the case of a component of the type mentioned in the introduction, the object is achieved in that the gate pad is arranged in a corner of the power semiconductor chip. Sufficient coverage of the chip metallization layer can be achieved in this way despite a simple geometry of the metal shape and simple adjustability.

A preferred embodiment of the component according to the invention is distinguished by the fact that the power semiconductor chip is of square construction, that the metal mating element is of circular construction, and that the radius of the metal mating element is selected such that the gate pad remains freely accessible when the metal mating element is fitted onto the power semiconductor chip.

In the case of the square chip, even round metal shapes satisfy the requirements of current distribution in the chip metallization layer. If the gate pad is bonded, the possibility of access for the wire bonder is likewise optimal in this arrangement.

In the case of another preferred embodiment, the metal mating element is likewise of rectangular construction and has a bevel at the corner which corresponds to the position of the gate pad, in such a way that the gate pad remains freely accessible when the metal mating element is fitted onto the power semiconductor chip.

Further embodiments emerge from the dependent claims.

BRIEF DESCRIPTION OF THE FIGURES

The invention will be explained in more detail below using exemplary embodiments in connection with the drawing, in which FIGS. 1a and 1b a plan view of a first known IGBT design and the associated metal mating element.

DISCUSSION OF THE PREFERRED EMBODIMENTS

Figure 1A:
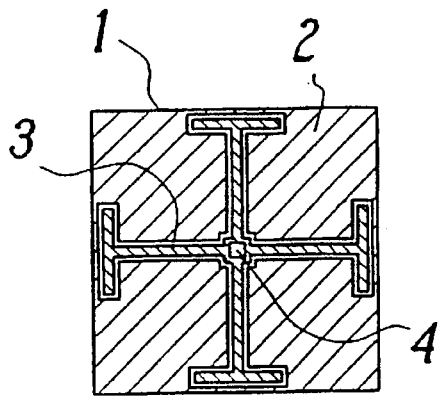
Figure 1B:
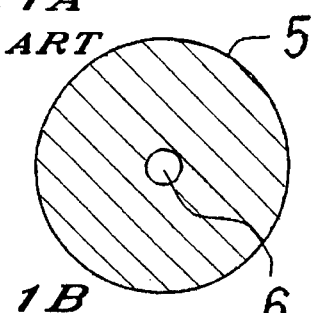
Figure 2A:
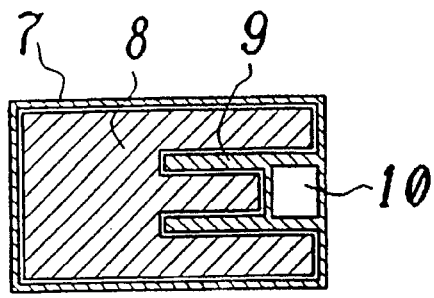
FIGS. 2a and 2b show a plan view of a second known IGBT design and the associated metal mating element.
Figure 2B:
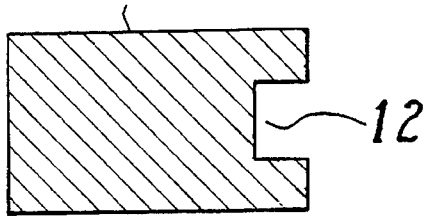

In the case of the exemplary embodiment of the invention that is illustrated in FIG. 3—equally as in the case of the known forms of FIGS. 1 and 2—the power semiconductor chip 13 is provided on its top side (front end) with a large-area metallization layer 14 (illustrated by hatched lines), which is normally the emitter metallization layer in the case of an IGBT. In order to drive the individual regions of the chip, provision is made, furthermore, of gate runners 15 which are distributed and branched, start at a common gate pad 16 and can be connected there to a gate connection (for example by bonding). The gate runners 15 are electrically isolated from the metallization layer 14 (for example by means of insulation illustrated by hatched lines), in such a way that it is possible to solder onto the metallization layer 14 large-area metal mating element which covers the gate runners 15 without making contact with them. The region of the gate pad 16 must at the same time remain free, in order that the electrical connection to the gate connection can be established there without any problems.

Figure 3A:
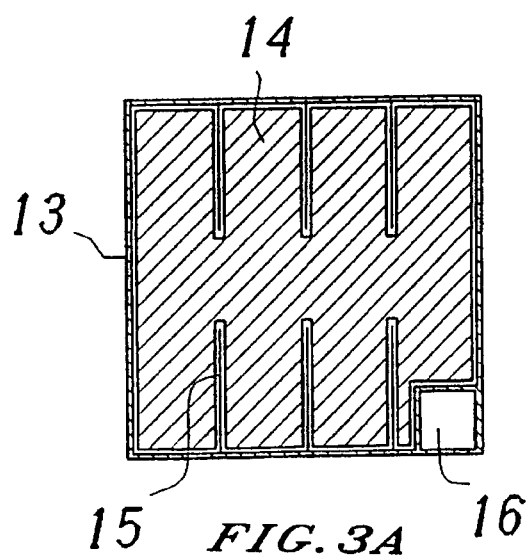
FIGS. 3a, 3b and 3c show a plan view of a preferred exemplary embodiment of an IGBT design according to the invention and two associated, suitable metal mating elements.
Figure 3B:
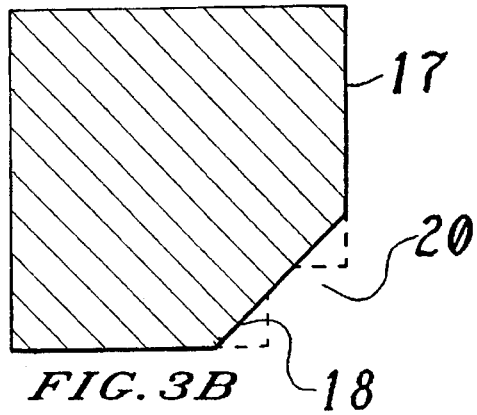
Figure 3C:
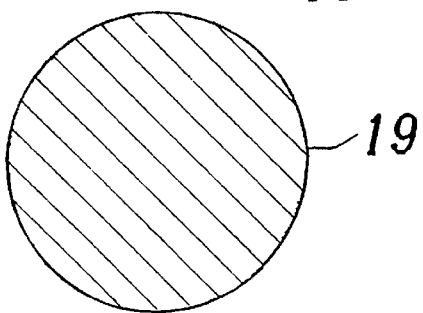

In order to enable the metal mating element to have shapes which are as simple as possible together with high coverage and at the same time simple adjustability, the semiconductor chip according to FIG. 3(a) is preferably of square construction and the gate pad 16 is arranged in a corner of the square. Metal mating elements having particularly simple shapes can be used on account of this configuration. A first Simple shape is represented in FIG. 3(b). The metal mating element 17 shown there has a square basic shape which is matched to the shape of the chip 13, and has a simple bevel 18 at the corner which corresponds to the position of the gate pad 16, to be precise such that the gate pad 16 remains freely accessible when the metal mating element 17 is fitted onto the power semiconductor chip 13. However, instead of the bevel 18, it is also possible—as is indicated by the dashed line in FIG. 3(b)—to provide a rectangular or square cutout 20 which leaves the gate pad 16 freely accessible when the metal mating element 17 is fitted A second, particularly simple shape is shown in FIG. 3(c). The metal mating element 19 is of circular construction here. The radius of the metal mating element 19 is selected such that the gate pad 16 remains freely accessible when the metal mating element 19 is fitted onto the power semiconductor chip 13.

The metal mating elements 17, 19 may be solid metal punches. However, they are preferably constructed in the form of metal disks which are made up of molybdenum and are soldered onto the metallization layer 14. It goes without saying here that the said invention can likewise be applied to other power semiconductor components having a gate connection, such as MOSFET and MCT, for example.

We claim:

1. Controllable power semiconductor component, comprising at least one planar, essentially rectangular power semiconductor chip, which power semiconductor chip has on its top side a large-area metallization layer for a large-area electrical connection to a metal mating element, and also comprising a separate small-area connection region for a gate connection in the form of a gate pad, which gate pad is arranged in a corner of the power semiconductor chip, wherein the metal mating element is constructed in the form of a metal disk, preferably made of molybdenum, in such a way that the gate pad remains freely accessible when the metal disk is fitted onto the power semiconductor chip.

2. Controllable power semiconductor component, comprising at least one planar, power semiconductor chip, which power semiconductor chip has on its top side a large-area metallization layer for a large-area electrical connection to a metal mating element, and also comprising a separate small-area connection region for a gate connection in the form of a gate pad wherein the power semiconductor chip is of square construction, the metal mating element is of circular construction, and the radius of the metal mating element is selected such that the gate pad remains freely accessible when the metal mating element is fitted onto the power semiconductor chip.

3. Power semiconductor component according to claim 1, wherein the metal mating disk is soldered onto the power semiconductor chip.

4. Power semiconductor component according to claim 2, wherein the metal mating element is soldered onto the power semiconductor chip.

5. Power semiconductor component according to claim 2, wherein the metal mating element is constructed in the form of a metal disk, preferably made of molybdenum, and in that the metal mating disk is soldered onto the power semiconductor chip.

* * * * *